US010797725B2

(12) United States Patent
Kim et al.

(10) Patent No.: US 10,797,725 B2
(45) Date of Patent: Oct. 6, 2020

(54) PARALLEL-TO-SERIAL CONVERSION CIRCUIT

(71) Applicants: SK hynix Inc., Gyeonggi-do (KR); Seoul National University R&DB Foundation, Seoul (KR)

(72) Inventors: Suhwan Kim, Seoul (KR); Joo-Hyung Chae, Seoul (KR)

(73) Assignees: SK hynix Inc., Gyeonggi-do (KR); Seoul National University R&DB Foundation, Seoul (KR)

(*) Notice: Subject to any disclaimer, the term of this patent is extended or adjusted under 35 U.S.C. 154(b) by 0 days.

(21) Appl. No.: 16/713,414

(22) Filed: Dec. 13, 2019

(65) Prior Publication Data

US 2020/0195274 A1 Jun. 18, 2020

(30) Foreign Application Priority Data

Dec. 17, 2018 (KR) .................. 10-2018-0163280

(51) Int. Cl.
*H03M 9/00* (2006.01)
*H03M 7/04* (2006.01)

(52) U.S. Cl.
CPC .............. *H03M 9/00* (2013.01); *H03M 7/04* (2013.01)

(58) Field of Classification Search
CPC ................................. H03M 9/00; H03M 7/04
USPC ................................................. 341/100, 101
See application file for complete search history.

(56) References Cited

U.S. PATENT DOCUMENTS

| | | | | |
|---|---|---|---|---|
| 5,570,356 A * | 10/1996 | Finney | ............ | H04Q 11/04 341/100 |
| 5,982,309 A * | 11/1999 | Xi | ............ | H03M 9/00 341/101 |
| 7,973,777 B2 * | 7/2011 | Lee | ............ | G06F 1/3215 345/175 |
| 8,212,759 B2 * | 7/2012 | Luo | ............ | G09G 3/2096 345/100 |
| 8,405,785 B1 * | 3/2013 | Auld | ............ | G09G 3/3611 345/204 |
| 8,525,770 B2 * | 9/2013 | Shin | ............ | G09G 3/2092 345/87 |
| 8,593,313 B2 * | 11/2013 | Koyanagi | ............ | H03M 9/00 341/100 |

(Continued)

FOREIGN PATENT DOCUMENTS

KR 10-2009-0039295 4/2009

OTHER PUBLICATIONS

Chae, J.H. et al, A 12.8Gb/s Quarter-Rate Transmitter using a 4:1 Overlapped Multiplexing Driver Combined with an Adaptive Clock Phase Aligner, Transaction on Circuits and Systems II: Express Briefs, 2018, pp. 1-5, IEEE.

*Primary Examiner* — Jean B Jeanglaude
(74) *Attorney, Agent, or Firm* — IP & T Group LLP

(57) ABSTRACT

A parallel-to-serial conversion circuit may include first to fourth data lines; first to fourth parallel-to-serial converters configured to parallel-to-serial convert data of corresponding two data lines, among the first to fourth data lines, at a ratio of 2:1, respectively; and first to fourth drivers configured to transmit converted data of corresponding parallel-to-serial converter, among the first to fourth parallel-to-serial converters, respectively, to an output line, wherein two of the first to fourth drivers are simultaneously activated.

8 Claims, 3 Drawing Sheets

(56) References Cited

U.S. PATENT DOCUMENTS

| | | |
|---|---|---|
| 9,419,736 B2 | 8/2016 | Bae et al. |
| 2006/0262065 A1* | 11/2006 | Luo .................... G09G 3/3685 345/98 |

* cited by examiner

PARALLEL-TO-SERIAL CONVERSION CIRCUIT

CROSS-REFERENCE TO RELATED APPLICATION

This application claims priority under 35 U.S.C. § 119 to Korean Patent Application No. 10-2018-0163280 filed on Dec. 17, 2018, which is incorporated herein by reference in its entirety.

BACKGROUND

1. Field

Exemplary embodiments relate to a parallel-to-serial conversion circuit.

2. Discussion of the Related Art

Although demands for high speed integrated circuits are increasing, data processing speeds of the integrated circuits are physically limited. For data processing at high speed, within the integrated circuits, data is internally processed in parallel, and the data in parallel is serialized and outputted. Further, serial data is inputted to the integrated circuits and is processed in parallel within the integrated circuits. In other words, a parallel-to-serial conversion circuit is used to convert the data in parallel within the integrated circuits into serial data and to output the serial data to outside the integrated circuits.

For example, an N:1 parallel-to-serial conversion circuit may be implemented within integrated circuits. At an output terminal of an N:1 parallel-to-serial conversion circuit, N outputs are connected together, which causes a concern that a capacitance of the output terminal becomes too large to lower an operating speed and increase power consumption.

SUMMARY

Various embodiments are directed to a parallel-to-serial conversion circuit in which an output capacitance value is reduced and signal integrity is improved.

In an embodiment, a parallel-to-serial conversion circuit may include: first to fourth data lines; first to fourth parallel-to-serial converters configured to parallel-to-serial convert data of corresponding two data lines, among the first to fourth data lines, at a ratio of 2:1, respectively; and first to fourth drivers configured to transmit converted data of corresponding parallel-to-serial converter, among the first to fourth parallel-to-serial converters, respectively, to an output line, wherein two of the first to fourth drivers are simultaneously activated.

In an embodiment, a parallel-to-serial conversion circuit may include: first to fourth data lines; a first parallel-to-serial converter configured to parallel-to-serial convert data of the fourth data line and data of the first data line at a ratio of 2:1; a second parallel-to-serial converter configured to parallel-to-serial convert the data of the first data line and data of the second data line at a ratio of 2:1; a third parallel-to-serial converter configured to parallel-to-serial convert the data of the second data line and data of the third data line at a ratio of 2:1; a fourth parallel-to-serial converter configured to parallel-to-serial convert the data of the third data line and data of the fourth data line at a ratio of 2:1; a first driver configured to be activated in response to a first clock and to transmit converted data of the first parallel-to-serial converter to an output line; a second driver configured to be activated in response to a second clock with a phase difference of 90° with respect to the first clock and to transmit converted data of the second parallel-to-serial converter to the output line; a third driver configured to be activated in response to a third clock with a phase difference of 90° with respect to the second clock and to transmit converted data of the third parallel-to-serial converter to the output line; and a fourth driver configured to be activated in response to a fourth clock with a phase difference of 90° with respect to the third clock and to transmit converted data of the fourth parallel-to-serial converter to the output line.

In an embodiment, a circuit may include: a plurality of data lines in parallel, configured to output a plurality of input data; and a plurality of data converters configured to receive the plurality of input data in parallel and convert the plurality of input data to a plurality of output data in series, each input data having a first rate, each output data having a second rate corresponding to a quarter of the first rate, wherein each of the plurality of data converters: receives a pair including two different input data among the plurality of input data; generates the two input data as two serial data, each of the two serial data having a third rate corresponding to half of the first rate; and outputs the two serial data as two output data among the plurality of output data.

In accordance with the embodiments, the output capacitance value of the parallel-to-serial conversion circuit can be reduced and signal integrity can be improved.

DETAILED DESCRIPTION

Figure 1:
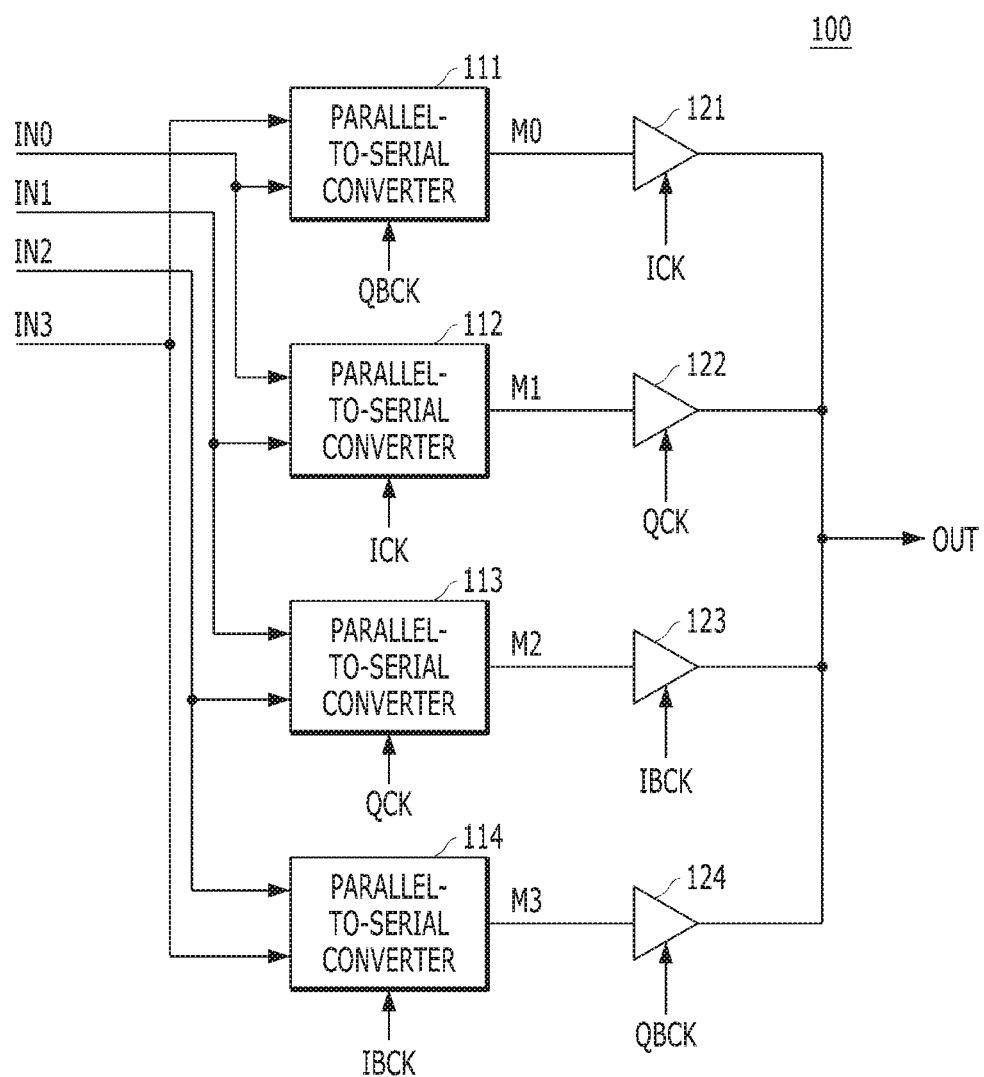
FIG. 1 is a diagram illustrating a parallel-to-serial conversion circuit in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Throughout the specification, when one element is referred to as being 'connected to' or 'coupled to' another element, it may indicate that the former element is directly connected or coupled to the latter element or electrically connected or coupled to the latter element with another element interposed therebetween. Furthermore, when an element "includes" or "comprises" a component, it means that the element does not exclude another component but may further include or comprise another component, unless referred to the contrary. Moreover, although components described in the specification are represented in the form of a singular form, the present embodiment is not limited thereto, but the corresponding components may also be represented in the form of a plural form.

FIG. 1 is a diagram illustrating a parallel-to-serial conversion circuit 100 in accordance with an embodiment.

Referring to FIG. 1, the parallel-to-serial conversion circuit 100 may include first to fourth data lines IN0 to IN3, first to fourth parallel-to-serial converters 111 to 114, first to fourth drivers 121 to 124, and an output line OUT.

The first to fourth data lines IN0 to IN3 are input lines of the parallel-to-serial conversion circuit 100. Parallel data to be parallel-to-serial converted by the parallel-to-serial conversion circuit 100 may be loaded on the first to fourth data lines IN0 to IN3.

The first to fourth parallel-to-serial converters 111 to 114 may be respectively coupled to two corresponding data lines among the first to fourth data lines IN0 to IN3. The first to fourth parallel-to-serial converters 111 to 114 may parallel-to-serial convert data of two data lines, which correspond to the first to fourth parallel-to-serial converters 111 to 114 among the first to fourth data lines IN0 to IN3, at a ratio of 2:1, respectively. The first to fourth parallel-to-serial converters 111 to 114 may operate using first to fourth clocks QBCK, ICK, QCK and IBCK. Clocks ICK and QCK have a phase difference of 90°. Clocks QCK and IBCK have a phase difference of 90°. Clocks IBCK and QBCK have a phase difference of 90°. Clocks QBCK and ICK have a phase difference of 90°.

The first parallel-to-serial converter 111 may parallel-to-serial convert data of the fourth data line IN3 and data of the first data line IN0 at a ratio of 2:1, and output the converted data to a line M0. When the fourth clock QBCK is activated, that is, the fourth clock QBCK has a high level, the first parallel-to-serial converter 111 may select the data of the fourth data line IN3 and output the selected data to the line M0. When the fourth clock QBCK is deactivated, that is, the fourth clock QBCK has a low level, the first parallel-to-serial converter 111 may select the data of the first data line IN0 and output the selected data to the line M0.

The second parallel-to-serial converter 112 may parallel-to-serial convert the data of the first data line IN0 and data of the second data line IN1 at a ratio of 2:1, and output the converted data to a line M1. When the first clock ICK is activated, that is, the first clock ICK has a high level, the second parallel-to-serial converter 112 may select the data of the first data line IN0 and output the selected data to the line M1. When the first dock ICK is deactivated, that is, the first clock ICK has a low level, the second parallel-to-serial converter 112 may select the data of the second data line IN1 and output the selected data to the line M1.

The third parallel-to-serial converter 113 may parallel-to-serial convert the data of the second data line IN1 and data of the third data line IN2 at a ratio of 2:1, and output the converted data to a line M2. When the second clock QCK is activated, that is, the second clock QCK has a high level, the third parallel-to-serial converter 113 may select the data of the second data line IN1 and output the selected data to the line M2. When the second clock QCK is deactivated, that is, the second clock QCK has a low level, the third parallel-to-serial converter 113 may select the data of the third data line IN2 and output the selected data to the line M2.

The fourth parallel-to-serial converter 114 may parallel-to-serial convert the data of the third data line IN2 and data of the fourth data line IN3 at a ratio of 2:1, and output the converted data to a line M3. When the third clock IBCK is activated, that is, the third clock IBCK has a high level, the fourth parallel-to-serial converter 114 may select the data of the third data line IN2 and output the selected data to the line M3. When the third clock IBCK is deactivated, that is, the third clock IBCK has a low level, the fourth parallel-to-serial converter 114 may select the data of the fourth data line IN3 and output the selected data to the line M3.

The first to fourth drivers 121 to 124 may transmit the converted data of the parallel-to-serial converters, which correspond to the first to fourth drivers 121 to 124 among first to fourth parallel-to-serial converters 111 to 114, respectively, to the output line OUT. Two of the first to fourth drivers 121 to 124 may be simultaneously activated at a time. The first driver 121 may be activated when the first clock ICK is activated and transmit the data of the line M0 to the output line OUT. The second driver 122 may be activated when the second clock QCK is activated and transmit the data of the line M1 to the output line OUT. The third driver 123 may be activated when the third clock IBCK is activated and transmit the data of the line M2 to the output line OUT. The fourth driver 124 may be activated when the fourth clock QBCK is activated and transmit the data of the line M3 to the output line OUT. Since drivers activated at the same time transmit substantially the same data to the output line OUT, collision of data different from each other may not occur, which will be described in detail with reference to FIG. 3.

Figure 2:
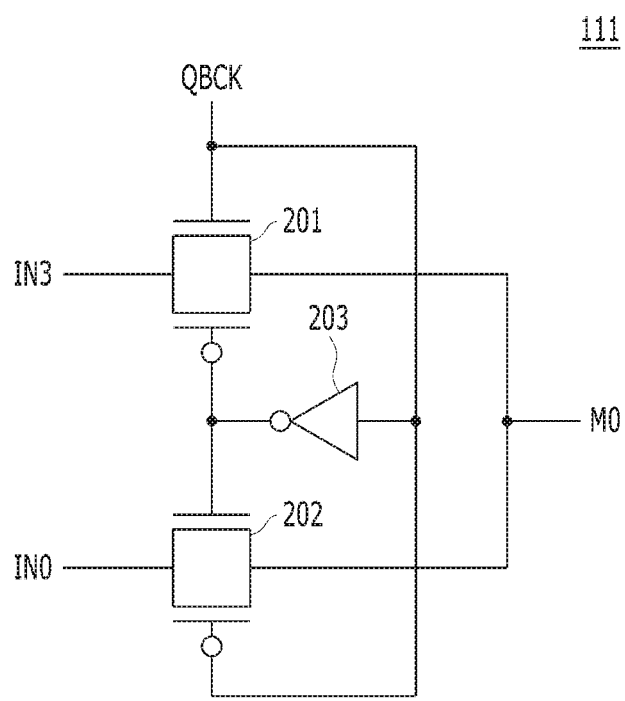
FIG. 2 is a diagram illustrating a first parallel-to-serial converter in accordance with an embodiment.

FIG. 2 is a diagram illustrating a first parallel-to-serial converter in accordance with an embodiment, for example, the first parallel-to-serial converter 111 of FIG. 1.

Referring to FIG. 2, the first parallel-to-serial converter 111 may include pass gates 201 and 202, and an inverter 203. The pass gates 201 and 202 may be turned on or turned off in response to the fourth clock QBCK.

When the fourth clock QBCK is activated to a high level, the pass gate 201 may be turned on to transfer the data of the fourth data line IN3 to the line M0. When the fourth clock QBCK is deactivated to a low level, the pass gate 202 may be turned on to transfer the data of the first data line IN0 to the line M0.

The second to fourth parallel-to-serial converters 112 to 114 may be configured similarly to the first parallel-to-serial converter 111.

Figure 3:
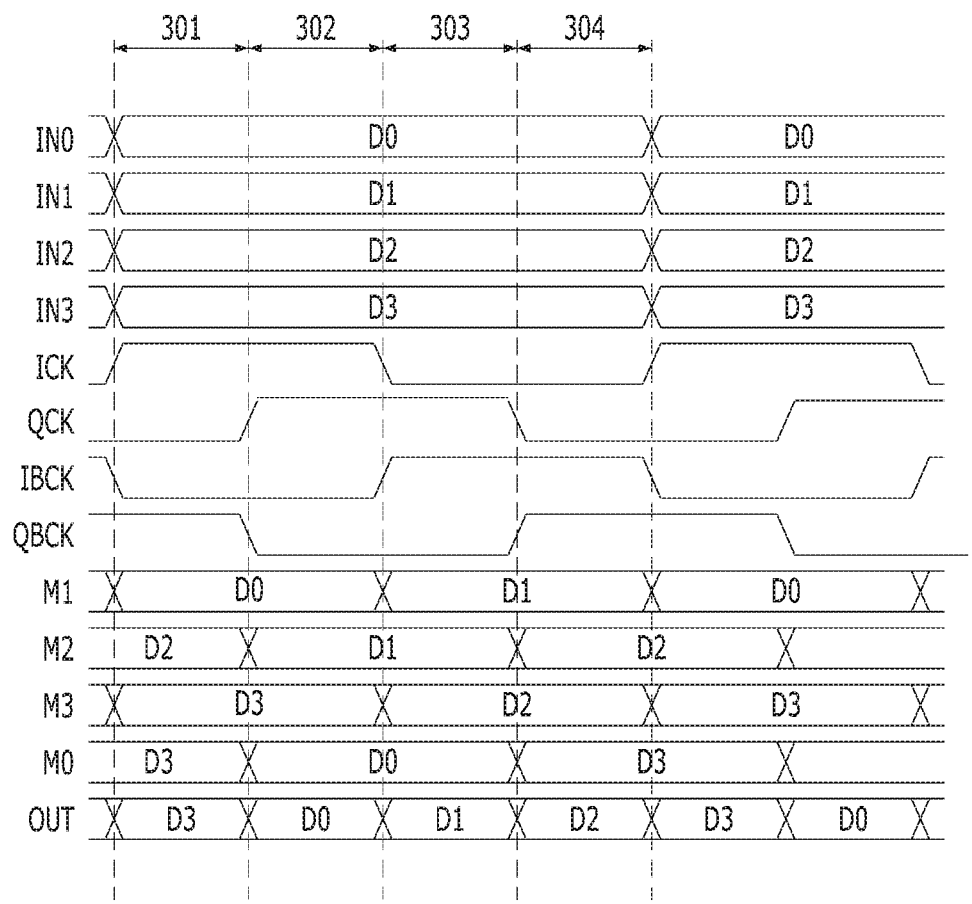
FIG. 3 is a timing diagram illustrating an operation of a parallel-to-serial conversion circuit in accordance with an embodiment.

FIG. 3 is a timing diagram illustrating an operation of a parallel-to-serial conversion circuit in accordance with an embodiment, for example, the parallel-to-serial conversion circuit 100 of FIG. 1.

In FIG. 3, D0 indicates the data of the first data line IN0, D1 indicates the data of the second data line IN1, D2 indicates the data of the third data line IN2, and D3 indicates the data of the fourth data line IN3.

The first parallel-to-serial converter 111 parallel-to-serial converts the data D3 of the fourth data line IN3 and the data D0 of the first data line IN0 at a ratio of 2:1, and outputs the converted data to the line M0. Accordingly, the data D3 and the data D0 are alternately loaded on the line M0.

The second parallel-to-serial converter 112 parallel-to-serial converts the data D0 of the first data line IN0 and the data D1 of the second data line IN1 at a ratio of 2:1, and outputs the converted data to the line M1. Accordingly, the data D0 and the data D1 are alternately loaded on the line M1.

The third parallel-to-serial converter 113 parallel-to-serial converts the data D1 of the second data line IN1 and the data D2 of the third data line IN2 at a ratio of 2:1, and outputs the converted data to the line M2. Accordingly, the data D1 and the data D2 are alternately loaded on the line M2.

The fourth parallel-to-serial converter 114 parallel-to-serial converts the data D2 of the third data line IN2 and the data D3 of the fourth data line IN3 at a ratio of 2:1, and outputs the converted data to the line M3. Accordingly, the data D2 and the data D3 are alternately loaded on the line M3.

During a first period 301 in which the fourth clock QBCK and the first clock ICK are activated to a high level, the fourth driver 124 and the first driver 121 may be simultaneously activated. During the first period 301, since the data D3 is loaded on the lines M3 and M0, the fourth driver 124 and the first driver 121 may transfer substantially the same data D3 to the output line OUT.

During a second period 302 in which the first clock ICK and the second clock QCK are activated to a high level, the first driver 121 and the second driver 122 may be simultaneously activated. During the second period 302, since the data D0 is loaded on the lines M0 and M1, the first driver 121 and the second driver 122 may transfer substantially the same data D0 to the output line OUT.

During a third period 303 in which the second clock QCK and the third clock IBCK are activated to a high level, the second driver 122 and the third driver 123 may be simultaneously activated. During the third period 303, since the data D1 is loaded on the lines M1 and M2, the second driver 122 and the third driver 123 may transfer substantially the same data D1 to the output line OUT.

As a consequence, the data of the first to fourth data lines IN0 to IN3 may be parallel-to-serial converted at a ratio of 4:1 and may be loaded on the output line OUT.

The parallel-to-serial conversion circuit 100 operates in such a manner that two of the four drivers 121 to 124 simultaneously drive the output line OUT. Consequently, driving abilities and sizes of the drivers 121 to 124 may be designed to a half as compared with a case where one driver drives an output line, thereby reducing a capacitance component generated in the output line OUT. Furthermore, two drivers simultaneously drive the output line OUT, thereby improving signal integrity of the parallel-to-serial conversion circuit 100.

Although various embodiments have been described for illustrative purposes, it will be apparent to those skilled in the art that various changes and modifications may be made without departing from the spirit and scope of the invention as defined in the following claims.

What is claimed is:

1. A parallel-to-serial conversion circuit comprising:
   first to fourth data lines;
   first to fourth parallel-to-serial converters configured to parallel-to-serial convert data of corresponding two data lines, among the first to fourth data lines, at a ratio of 2:1, respectively; and
   first to fourth drivers configured to transmit converted data of corresponding parallel-to-serial converter, among the first to fourth parallel-to-serial converters, respectively, to an output line,
   wherein two of the first to fourth drivers are simultaneously activated.

2. The parallel-to-serial conversion circuit of claim 1, wherein the first parallel-to-serial converter parallel-to-serial converts data of the fourth data line and data of the first data line at a ratio of 2:1,
   the second parallel-to-serial converter parallel-to-serial converts the data of the first data line and data of the second data line at a ratio of 2:1,
   the third parallel-to-serial converter parallel-to-serial converts the data of the second data line and data of the third data line at a ratio of 2:1, and
   the fourth parallel-to-serial converter parallel-to-serial converts the data of the third data line and data of the fourth data line at a ratio of 2:1.

3. The parallel-to-serial conversion circuit of claim 2, wherein the fourth driver and the first driver are activated during a first period,
   the first driver and the second driver are activated during a second period,
   the second driver and the third driver are activated during a third period, and
   the third driver and the fourth driver are activated during a fourth period.

4. The parallel-to-serial conversion circuit of claim 3, wherein each of the first to fourth parallel-to-serial converters and each of the first to fourth drivers operate in synchronization with at least one of first to fourth docks with phases different from one another.

5. A parallel-to-serial conversion circuit comprising:
   first to fourth data lines;
   a first parallel-to-serial converter configured to parallel-to-serial convert data of the fourth data line and data of the first data line at a ratio of 2:1;
   a second parallel-to-serial converter configured to parallel-to-serial convert the data of the first data line and data of the second data line at a ratio of 2:1;
   a third parallel-to-serial converter configured to parallel-to-serial convert the data of the second data line and data of the third data line at a ratio of 2:1;
   a fourth parallel-to-serial converter configured to parallel-to-serial convert the data of the third data line and data of the fourth data line at a ratio of 2:1;
   a first driver configured to be activated in response to a first clock and to transmit converted data of the first parallel-to-serial converter to an output line;
   a second driver configured to be activated in response to a second clock with a phase difference of 90° with respect to the first clock and to transmit converted data of the second parallel-to-serial converter to the output line;
   a third driver configured to be activated in response to a third clock with a phase difference of 90° with respect to the second clock and to transmit converted data of the third parallel-to-serial converter to the output line; and
   a fourth driver configured to be activated in response to a fourth clock with a phase difference of 90° with respect to the third clock and to transmit converted data of the fourth parallel-to-serial converter to the output line.

6. The parallel-to-serial conversion circuit of claim 5, wherein the first parallel-to-serial converter selects and outputs the data of the fourth data line when the fourth clock is activated, and selects and outputs the data of the first data line when the fourth clock is deactivated,
   the second parallel-to-serial converter selects and outputs the data of the first data line when the first clock is activated, and selects and outputs the data of the second data line when the first clock is deactivated,
   the third parallel-to-serial converter selects and outputs the data of the second data line when the second clock is activated, and selects and outputs the data of the third data line when the second clock is deactivated, and
   the fourth parallel-to-serial converter selects and outputs the data of the third data line when the third clock is activated, and selects and outputs the data of the fourth data line when the third clock is deactivated.

7. A circuit comprising:
   a plurality of data lines in parallel, configured to output a plurality of input data; and
   a plurality of data converters configured to receive the plurality of input data in parallel and convert the plurality of input data to a plurality of output data in series, each input data having a first rate, each output data having a second rate corresponding to a quarter of the first rate, wherein each of the plurality of data converters:

receives a pair including two different input data among the plurality of input data;

generates the two input data as two serial data, each of the two serial data having a third rate corresponding to half of the first rate; and outputs the two serial data as two output data among the plurality of output data.

8. The circuit of claim 7, wherein the plurality of data converters comprises:

a plurality of parallel-to-serial converters; and a plurality of drivers, wherein each of plurality of parallel-to-serial converters receives a corresponding pair among the plurality of input data, and generates corresponding two serial data, wherein each of the plurality of drivers receives corresponding two serial data and corresponding two output data among the plurality of output data.

* * * * *